United States Patent [19]
Shiotsu et al.

[11] Patent Number: 6,078,633
[45] Date of Patent: Jun. 20, 2000

[54] PLL CIRCUIT AND ITS AUTOMATIC ADJUSTING CIRCUIT

[75] Inventors: Shinichi Shiotsu; Masaya Tamamura, both of Kawasaki, Japan

[73] Assignee: Fujitsu Limited, Kawasaki, Japan

[21] Appl. No.: 08/923,640

[22] Filed: Sep. 4, 1997

[30] Foreign Application Priority Data

Oct. 31, 1996 [JP] Japan ................................. 8-290578

[51] Int. Cl.[7] .................................................. H03D 3/24
[52] U.S. Cl. ........................... 375/374; 375/376; 327/159
[58] Field of Search ................................... 375/376, 374; 331/1 A, 16; 327/159, 160

[56] References Cited

U.S. PATENT DOCUMENTS

| | | | |
|---|---|---|---|
| 4,272,729 | 6/1981 | Riley, Jr. | 331/1 A |
| 4,528,523 | 7/1985 | Crowley | 331/10 |
| 5,614,870 | 3/1997 | Sauer et al. | 331/14 |

FOREIGN PATENT DOCUMENTS

| | | | |
|---|---|---|---|
| 0 360 442 A1 | 3/1990 | European Pat. Off. | H03L 7/189 |
| 2 258 096 | 1/1993 | United Kingdom | H03L 7/18 |
| WO 81 02497 A | 9/1981 | WIPO . | |
| WO 94 26041 | 11/1994 | WIPO . | |

*Primary Examiner*—Stephen Chin
*Assistant Examiner*—Dac V. Ha
*Attorney, Agent, or Firm*—Arent Fox Kintner Plotkin & Kahn

[57] ABSTRACT

A 1/N programmable frequency divider for dividing the frequency of an output clock CLK1 from a VCO is connected between the VCO and a phase comparator in a PLL circuit. An adjusting circuit includes a counter for detecting a half-value of the frequency and for addressing a table ROM to make it read out a program data N and target value TV, a counter for detecting a half-value of the frequency of the output clock CLK from the 1/N programmable frequency divider, a digital comparator for comparing the count value of the counter and the target value TV and an up/down counter for incrementing or decrementing is count CFV in accordance with the comparison result, the count CFV being provided to the control input of the VCO.

11 Claims, 10 Drawing Sheets

6,078,633

PLL CIRCUIT AND ITS AUTOMATIC ADJUSTING CIRCUIT

BACKGROUND OF THE INVENTION

1. Field of the Invention

The present invention relates to a PLL circuit, its automatic adjusting circuit, and a semiconductor device including same.

2. Description of the Related Art

A PLL circuit is used, for example, as a circuit to extract a clock signal from a serial signal in a receiver. The free running frequency of a VCO in the PLL circuit generally differs between semiconductor chips even if made from the same wafer because there is often a slight variation in the manufacturing process of semiconductor devices, varying the free running frequency about ±30 percent. Therefore, a PLL circuit with a wide capture range is required, and the circuit design therefore becomes complicated or difficult.

With this, a digital VCO with a variable center frequency setting is used for the PLL circuit as shown in FIG. 9. In this circuit, a phase comparator 10, a loop filter 11, a VCO control circuit 12, and a digital VCO 13 are connected in the loop shape.

The VCO control circuit 12 is a kind of analog to digital converter and outputs the digital value DV corresponding to the analog voltage AV. FIG. 10(A) shows the input-output characteristics of the VCO control circuit 12.

The frequency f of the output clock CLK from the digital VCO 13 is a linear function of the digital value DV. f/fc varies with the digital value DV as shown in FIG. 10(B), where fc is a center frequency at the digital value DV being a half of the maximum frequency value DVmax. The center frequency fc is determined by the center frequency setting value CFV from the center frequency setting circuit 14. fc/fco varies as shown in FIG. 10(C), where fco is a center free running frequency at the center frequency setting value CFV being a half of the maximum value CFVmax thereof. In this example, fc/fco is $0.8 \leq fc/fco \leq 1.2$.

For example, assume that both the frequency fr of the reference signal REF and the center free running frequency fco of the digital VCO 13 are set to 100 MHz and the real center free running frequency fco is 70 MHz. In this case, if the center frequency setting value CFV is set to the maximum value CFVmax, the center frequency fc increases by 20 percent and reaches a value of 84 MHz. In this PLL circuit, because the range of the output frequency f with the change in the digital value DV is $79.8 \text{ MHz} \leq f \leq 88.2 \text{ MHz}$. In this PLL circuit, the clock CLK cannot be locked into a phase synchronization state for a reference signal REF of 100 MHz.

As a result, the yield of semiconductor devices becomes low. To improve this yield, a digital VCO 13 with a wide range output frequency f is required. In this case, the digital VCO 13 becomes hard to design and the PLL circuit becomes expensive.

The output clock (feedback clock) CLK is provided to the oscilloscope with the digital value DV fixed to one-half of the maximum value DVmax to measure the output frequency f. The center frequency setting value CFV is adjusted so that the measured output frequency f becomes the reference frequency fr. This adjustment is done manually by an inspector before the semiconductor device is shipped. The center frequency setting circuit 14 is built into the semiconductor device with the PLL circuit and the switch element status is fixed depending on whether or not the fuse not shown in the figure has blown, fixing the center frequency setting value CFV.

In the prior art, such adjustments must be done for each semiconductor chip, slowing down the mass production of semiconductor chips.

SUMMARY OF THE INVENTION

Accordingly, an object of the present invention is to provide a PLL circuit, its automatic adjusting circuits and associated semiconductor devices which enable automatic adjustment such that the center frequency of the feedback clock approaches the reference signal frequency.

Another object of the present invention is to provide a PLL circuit, its automatic adjusting circuits and associated semiconductor devices which enable to automatic adjustment such that the center frequency of the feedback clock moves closer to the reference signal frequency.

According to the present invention, there is provided a PLL automatic adjusting circuit for adjusting a program data N in a PLL circuit, the PLL circuit including a 1/N programmable frequency divider for dividing an output frequency of a VCO, the 1/N programmable frequency divider being connected between an output of the VCO and one input of a phase comparator, the PLL automatic adjusting circuit comprising: a first counter for counting a output clock of the VCO for a set time; and a data converter for setting the program data N in accordance with a count value of the first counter.

With the present invention, because the programmable frequency divider is connected between the VCO and the phase comparator and the program data N of the programmable frequency divider is adjusted, the center frequency setting range of the VCO may be narrower than in a case where a programmable frequency divider is not used, and therefor, the design of the PLL circuit becomes more easy and the yield of the semiconductor devices including PLL circuits is improved.

Because the program data N is set automatically at the programmable frequency divider, (the center frequency of the VCO)/N, which is the feedback clock frequency, is automatically adjusted to approach the reference signal frequency.

Moreover, it becomes easy or unnecessary to adjust the semiconductor device containing the PLL circuit before being shipped, enabling improved mass production.

In the 1st mode of the present invention, the data converter is a memory for converting an input address value into a stored value.

With the 1st mode, because it can be applied to various types of PLL circuits by changing contents of the memory, the data converter can be widely used.

A 2nd mode of the present invention, further comprises: a control circuit for controlling, in response to an adjustment start signal, the output frequency of the VCO to a center free running frequency until the program data N has been set.

With the 2nd mode, the feedback clock frequency is adjusted more appropriately to be close to the reference signal frequency.

In the 3rd mode of the present invention, it further comprises: a register for receiving an output value of the data converter; wherein the control circuit controls the register to hold its input value after the output value of the data converter has been determined.

In the 4th mode of the present invention, the VCO has a control input for changing its input-output characteristic, and the data converter outputs a control setting value corresponding to a value of the first counter and the program data N in order to determine a value to be provided to the control input of the VCO.

With the 4th mode, because a fine adjustment by changing the input-output characteristic of the VCO are performed in addition to a rough adjustment by setting program data N at the programmable frequency divider, the center frequency of the feedback clock is adjusted automatically to be closer to the reference signal frequency.

A 5th mode of the present invention further comprises: a register for receiving the control setting value and for providing its holding value to the control input of the VCO; and a control circuit for making the register hold its input value after the control setting value having been determined.

With the 5th mode, because the output of the data converter is provided to the control input of the VCO via the register, the structure is more simplified and an adjustment time is shorter than in a case where a feedback adjustment is performed in accordance with the output of the data converter.

A 6th mode of the present invention further comprises: a second counter for counting an output clock of the 1/N programmable frequency divider for a set time; a comparator for comparing a count value of the second counter with the control setting value from the data converter; and an up/down counter for incrementing or decrementing in accordance with a comparison result of the comparator; a value based on a count value of the up/down counter being provided to the control input of the VCO.

With the 6th mode, the center frequency of the feedback clock is adjusted automatically to more closely approach the reference signal frequency than that in fifth mode. As a result, even if variation in VCO characteristic is relatively great because of variation in the manufacturing process of semiconductor devices, a phase is still locked quickly and accurately.

A 7th mode of the present invention further comprises: a control circuit for, in response to an adjustment start signal, fixing a value provided to an input of the VCO to approximately a center value until the program data N is set and for controlling a value of the control input of the VCO to approximately a center value until the value based on the count value of the up/down counter is provided to the control input.

With the 7th mode, the feedback clock frequency is adjusted to be close to the reference signal frequency more appropriately.

In the 8th mode of the present invention, the value provided to the control input of the VCO is the count value of the up/down counter.

A 9th mode of the present invention comprises: a first counter for counting a output clock of the VCO for a set time; a data converter for setting the program data N in accordance with a count value of the first counter; and a control circuit for controlling, in response to an adjustment start signal, the output frequency of the VCO to a center free running frequency until the program data N has been set.

A 10th mode of the present invention further comprises: a lock detecting circuit for detecting whether the PLL circuit has entered into a phase synchronizing state; and a timer for reactivating the adjustment start signal when a time, from the adjustment start signal becoming active to the lock detecting circuit detecting a phase synchronization state, has exceeded a set time.

With the 10th mode, even if the counter counts a noise and therefore adjustment becomes inappropriate and adjustment time is longer than time required for normal adjustments, readjustment is performed automatically and the reliability of adjustment is improved.

In the 11th mode of the present invention, an input value of the VCO is digital and the mode further comprises: a VCO control circuit, for converting an analog voltage to the digital value, arranged in a pre-stage of the VCO, the VCO control circuit having a control input for switching its output range from a first range to a second range, the second range being wider than the first range; and a lock detecting circuit for detecting a phase synchronization state and providing its detected signal to the control input of the VCO control circuit in order to set the output range of the VCO control circuit to the first range when it detects that the VCO control circuit is not in the phase synchronization state and in order to set the output range of the VCO control circuit to the second range when it detects the phase synchronization state.

Because the capture range of the PLL circuit is generally narrower than that of the lock range, with the 11th mode, pulling into a phase locked state and holding this phase locked state are performed properly by this switching.

DESCRIPTION OF THE PREFERRED EMBODIMENTS

Figure 1:
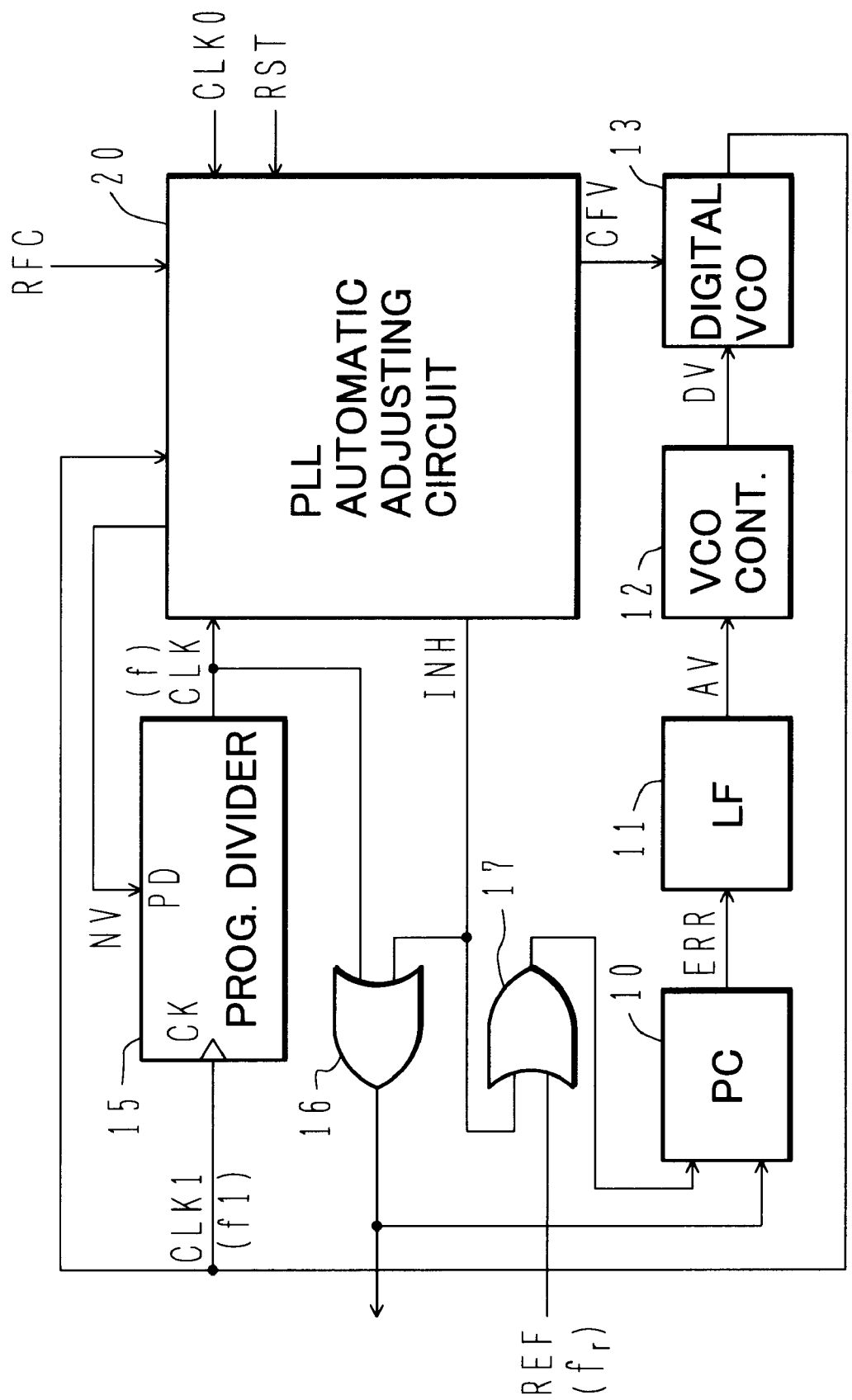
FIG. 1 is a block diagram showing a PLL circuit with an automatic adjusting circuit in the first embodiment of the present invention.

Referring now to the drawings, wherein like reference characters designate like or corresponding parts throughout several views, preferred embodiments of the present invention are described below.

First Embodiment

FIG. 1 shows a PLL circuit with an automatic adjusting circuit of the first embodiment. This PLL circuit with the automatic adjusting circuit is, for example, formed on one semiconductor chip (this also applies to the following other embodiments).

Figure 9:
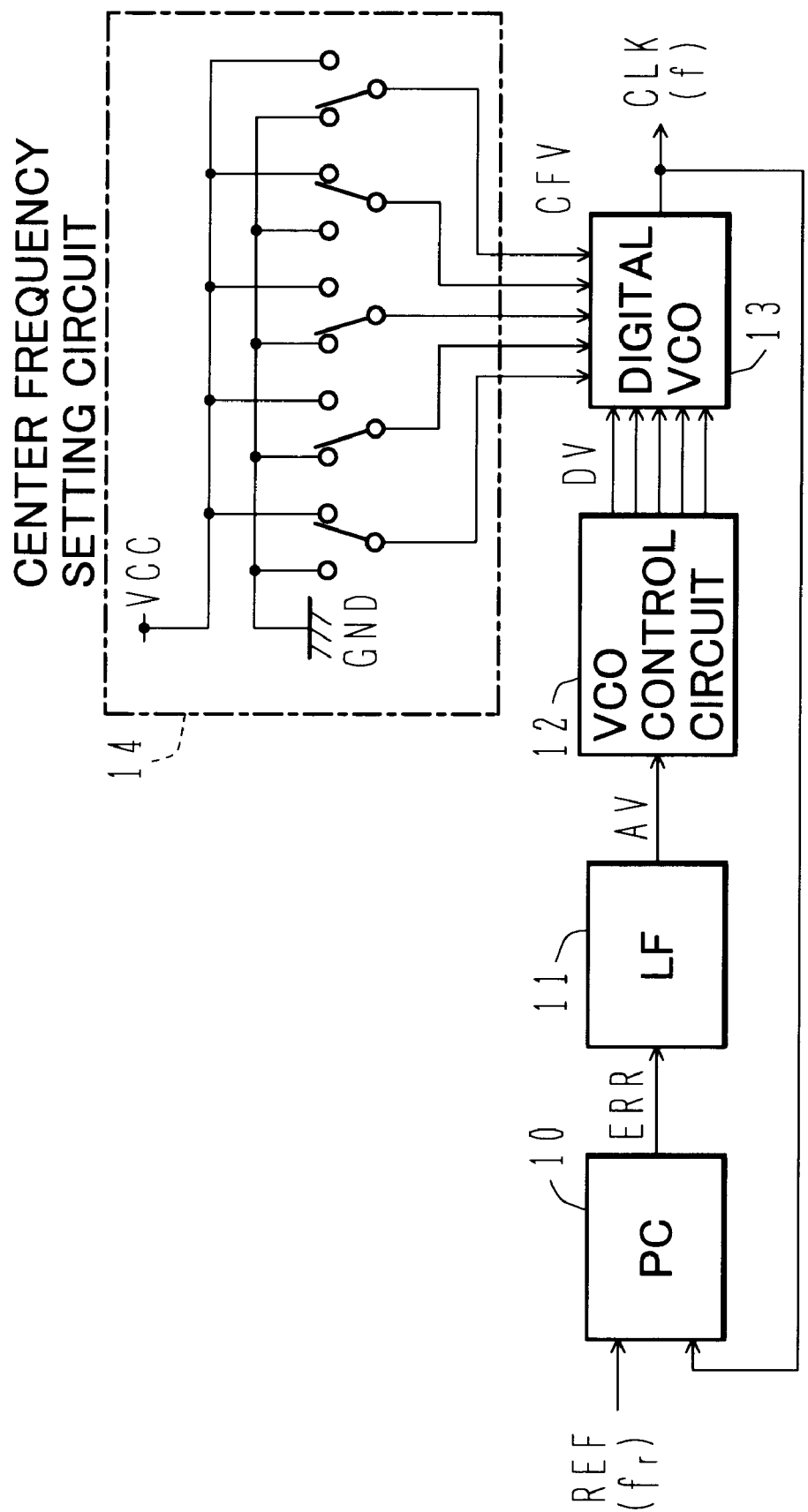
FIG. 9 is a block diagram of a conventional PLL circuit.

A phase comparator 10, a loop filter 11, a VCO control circuit 12, and a digital VCO (DCO) 13 are the same as those shown in FIG. 9 and these provides an output phase error signal ERR, an analog voltage AV, a digital value DV, and a clock CLK1 respectively. The analog voltage AV rises when the phase error signal ERR indicates that the phase of the output clock CLK is delayed as compared with that of the reference signal REF, whereas the analog voltage AV is lowered when the phase error signal ERR indicates that the phase of the output clock CLK is advanced. Operations of the VCO control circuit 12 and digital VCO 13 are the same as those described in the prior art section.

A programmable frequency divider 15 is connected between the output of the digital VCO 13 and one input of the phase comparator 10. The programmable frequency divider 15 provides output clock CLK of frequency f=f1NV obtained by dividing the frequency f1 of clock CLK1 provided to the clock input CK thereof into f1NV. The value NV is set on the program data input PD of the programmable frequency divider 15.

The output clock CLK is provided to one input of an OR gate 16, passes through the OR gate 16, and is then provided to one input of the phase comparator 10 as a feedback signal. The reference signal REF is a serial signal or a clock and is provided to one input of an OR gate 17, passes through OR gate 17, and is then provided to the other input of the phase comparator 10. The inhibition signal INH that controls the opening and closing of the OR gates 16 and 17 is provided to the other inputs of the OR gates 16 and 17.

When the inhibition signal INH is at a low voltage level, the OR gates 16 and 17 are opened and the phase synchronization control loop, which comprises the phase comparator 10, the loop filter 11, the VCO control circuit 12, the digital VCO 13 and the programmable frequency divider 15, is formed. In this loop, if the phase of the output clock CLK is advanced as compared to that of the reference signal REF, then the output voltage AV of the loop filter 11 is lowered, the frequency f1 of the clock CLK1 is lowered, and the frequency f of the output clock CLK is also lowered to make the phase delay of the output clock CLK relative to the reference signal REF small. Whereas, if the phase of the output clock CLK is delayed as compared to that of the reference signal REF, then the output voltage AV of the loop filter 11 rises, the frequency f1 of the clock CLK1 rises, and the frequency f of the output clock CLK also rises to make the phase advance of the output clock CLK relative to the reference signal REF small.

To a PLL automatic adjusting circuit 20, a reset signal RST as an adjustment start signal, a base clock CLK0, the reference clock CLK1, the output clock CLK, and a reference frequency code RFC are provided. The PLL automatic adjusting circuit 20 outputs the above programmable data NV and the inhibition signal INH, and provides a center frequency setting value CFV to the center frequency control input of the digital VCO 13.

Figure 2:
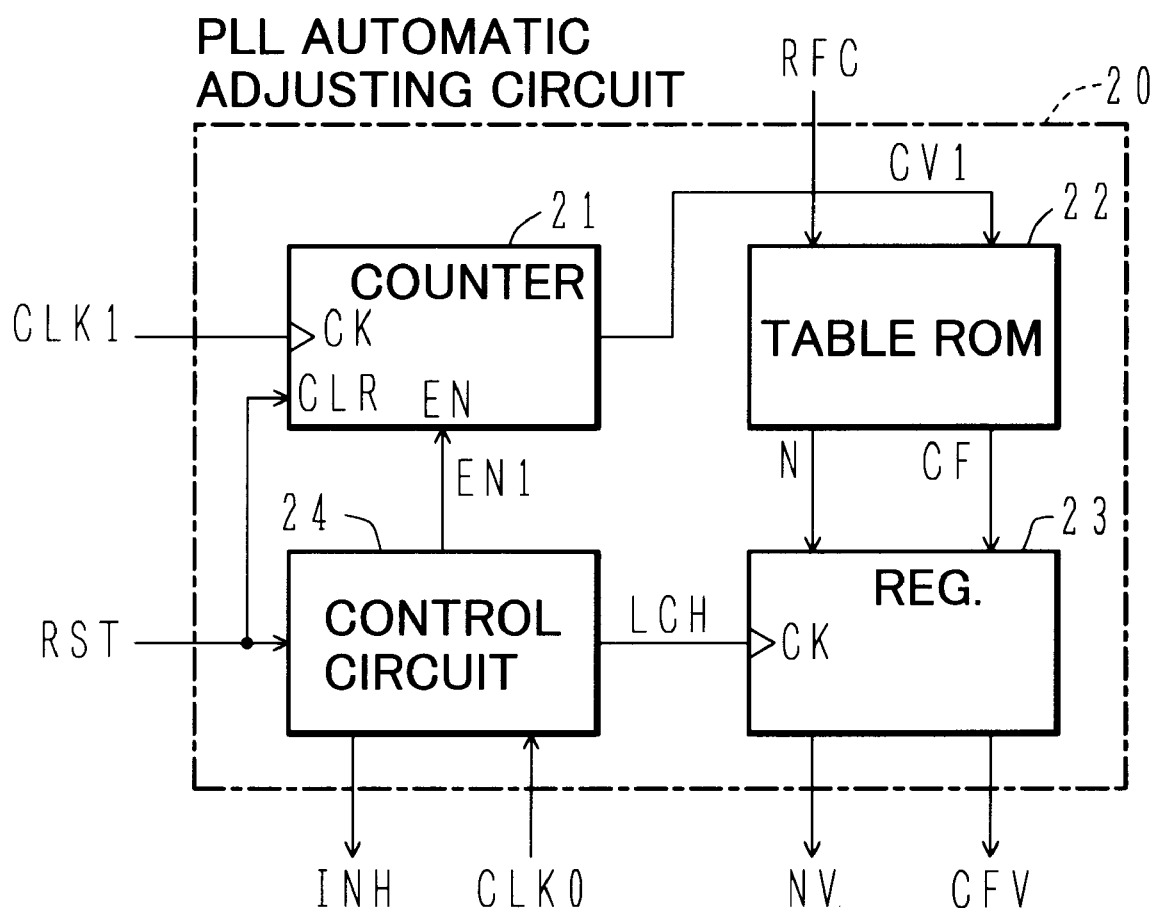
FIG. 2 is a block diagram showing a configuration example of the PLL automatic adjusting circuit in FIG. 1.

FIG. 2 shows a configuration example of the PLL automatic adjusting circuit 20.

In this circuit 20, the clock CLK1 is provided to the clock input CK of a counter 21, the rise of the clock CLK1 is counted when an enable signal input EN is at a high voltage level, a count value CV1 is provided to the lower order address input of a table ROM 22 used as a data converter. To the higher order address input of the table Rom 22, a reference frequency code RFC is provided. A pair of a program data N and center frequency setting value CF, as one word data, is read out from the table ROM 22 and provided to the data input of a register 23.

The following TABLE I shows a concrete example of the relationship between addresses of the table ROM 22 and the values stored in these addresses.

TABLE I

| | ADDRESS | | STORED VALUE | |
|---|---|---|---|---|
| $f_r$ | RFC | CV1 ($f_{co}/2$) | N | CF |
| 40 MHz | 0 | 50 | 3 | 31 |
| | 0 | 55 | 3 | 23 |
| | 0 | 60 | 3 | 16 |
| | 0 | 190 | 10 | 20 |
| | 0 | 195 | 10 | 17 |
| | 0 | 200 | 10 | 16 |
| 50 MHZ | 1 | 50 | 2 | 16 |
| | 1 | 55 | 2 | 8 |
| | 1 | 60 | 2 | 3 |
| 60 MHz | 2 | 90 | 3 | 16 |
| | 2 | 100 | 3 | 8 |
| | 2 | 110 | 3 | 1 |

TABLE I indicates that the reference frequency is 40 MHz, 50 MHz, or 60 when the reference frequency code RFC is 0, 1, or 2, respectively. The frequency of base clock CLK0 is 1 MHz and in this case, CV1=fco/2.

For example, if the reference frequency code RFC is 1 and the count value CV1 is 55, then the program data N is 2 and the center frequency setting value CF is 8. As exceptional cases, for CV1=0, each of the storage contents of the table ROM 22 is CFmax/2 regardless of the value of the reference frequency code RFC.

To a control circuit 24, the reset signal RST and the base clock CLK0 are provided. The control circuit 24 provides an enable signal ENI to the enable signal input EN of the counter 21, provides a latch signal LCH to the clock input CK of the register 23, and outputs the inhibition signal INH.

Figure 3:
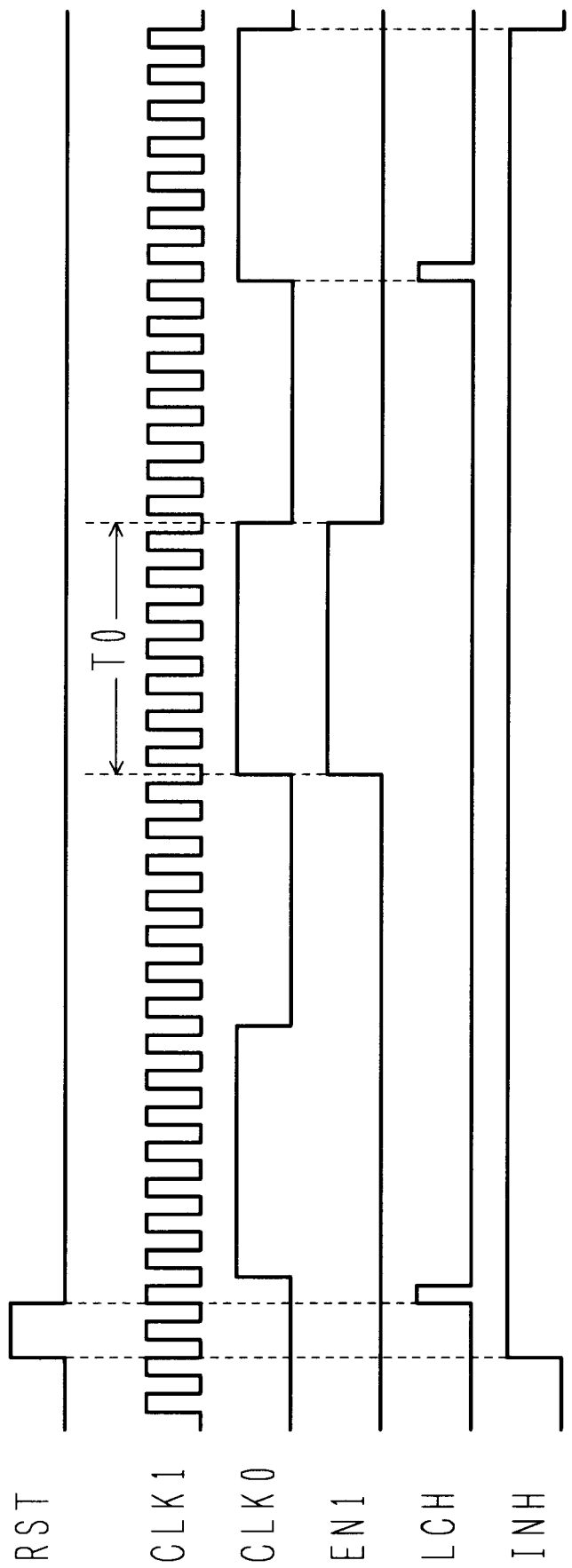
FIG. 3 is a timing chart showing operations of a control circuit in FIG. 2.

Next, operations of the circuits shown in FIGS. 1 and 2 are described by making reference to FIG. 3 which shows the operation of the control circuit 24.

For example, the circuit shown in FIG. 1 is used for a communications device. When the pulse of the reset signal RST is provided to the control circuit 24 by turning on the power for the communication device, the control circuit 24 raises the voltage level of the inhibition signal INH. By this operation, the OR gates 16 and 17 are closed, the phase error signal ERR indicates error 0, and each of the analog voltage AV and the digital value DV becomes the center value within the ranges. The pulse of the reset signal RST clears the count value CV1 of the counter 21 to zero. CFmax/2 is read our from the table ROM 22 as the center frequency setting value CF regardless of the value of the reference frequency code RFC. This center frequency setting value CF is held in register 23 when the latch signal LCH rises.

Accordingly, the frequency f1 of the clock CLK1 becomes the center free running frequency fco.

For example, when the control circuit 24 twice detects a rise in the base clock CLK0, it raises the voltage level of the enable signal EN1 during the time T0 until the base clock CLK0 falls. The counter 21 counts rise in the clock CLK1 while the enable signal EN1 remains at a high voltage level.

The address of the table ROM 22 is specified by the reference frequency code RFC and the count value CV1, the program data N and center frequency setting value CF is read out from the table ROM 22, and provided to the data input of the register 23.

The latch signal LCH rises when the base clock CLK0 rises again. At this timing, the program data N and center frequency setting value CF is held in the register 23 as NV and CFV respectively.

Figure 10A:
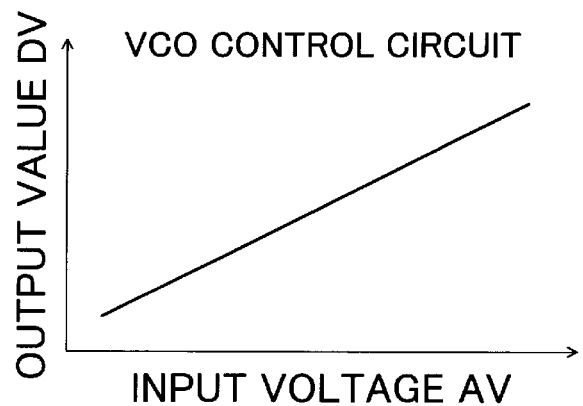
FIG. 10(A) is a input-output characteristic diagram of a VCO control circuit shown in FIG. 9 and FIGS. 10(B) and 10(C) are input-output characteristic diagrams of a digital VCO shown in FIG. 9.
Figure 10B:
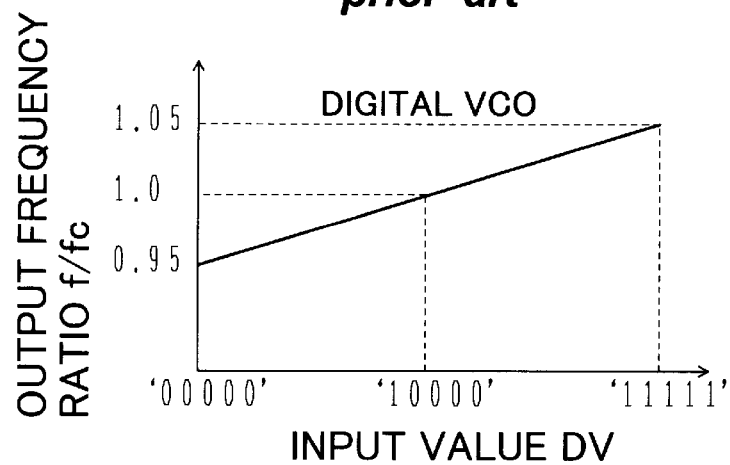
Figure 10C:
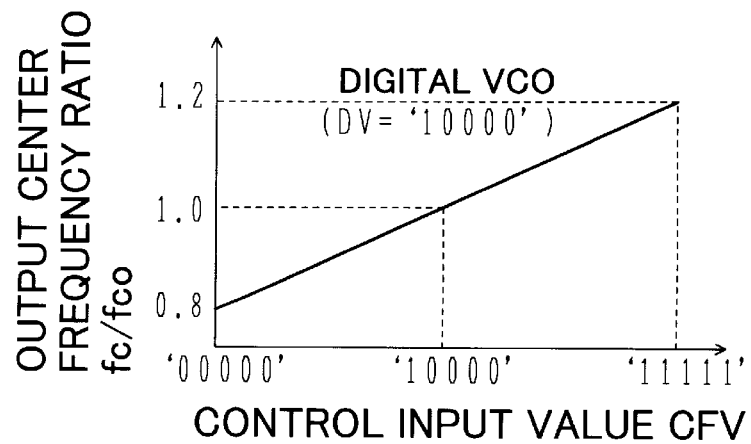

The program data N is specified such that |fco/N−fr| is minimized. The center frequency setting value CF is specified such that (fr;N−fco)/fco:$\mu$=(CF−CFmax/2): (CFmax/2), where CFmax indicates the maximum value of the center frequency setting value CF and the ratio $\mu$ is of the range 1−$\mu$≦fc/fco≦1+$\mu$ shown in FIG. 10(C), e.g., $\mu$ is 0.2. The ratio $\mu$ is an empirically determined value. Approximately, the ratio $\mu$ may be assumed to be a fixed value regardless of the value of the center free running frequency fco, or to be an empirical value in accordance with the value of the center free running frequency fco. From the above formula, the center frequency setting value CF can be represented by the following formula.

$$CF=(CFmax/2)\{1+(fr\cdot N/fco-1)/\mu\}$$

The CF value is made an integer and limited within the range below the settable maximum value CFmax. CF in TABLE I is calculated based on the above formula under the conditions $\mu$=0.2 and CFmax=31. These values do not exceed the settable maximum value 31.

The program data NV is provided to the program data input PD of the programmable frequency divider 15. The set value of the center frequency value CFV is provided to the center frequency control input of digital VCO 13.

With this, setting the programmable frequency divider 15 and the digital VCO 13 are completed.

The voltage level of the inhibition signal INH is lowered synchronized with the next fall in the base clock CLK0, the OR gates 16 and 17 are opened, and the phase synchronization control loop becomes valid.

With this first embodiment, the PLL automatic adjusting circuit 20 automatically sets the center frequency setting value CFV of the digital VCO 13 and the program data NV of the programmable frequency divider 15, which are to be adjusted values. As a result, mass production is more feasible because the semiconductor device containing the PLL circuit needs not be adjusted before being shipped.

Because adjusted values are updated each time the reset pulse is provided by a power-on or other operation, even if the characteristic of the digital VCO 13 have been altered by an ambient temperature change or by a time-varying of its circuit element characteristic, the appropriate adjusted values are always set.

The programmable frequency divider 15 is connected between the digital VCO 13 and the phase comparator 10, and the program data NV of the programmable frequency divider 15 is adjusted. Therefore, as obvious from TABLE I, the range of the center frequency setting value CFV of the digital VCO 13 is narrower than that in the case when the programmable frequency divider 15 is not used. This makes the PLL circuit design easier and improves the yield of semiconductor devices including PLL circuits.

Second Embodiment

The ratio $\mu$ is a presumed value in the above first embodiment and assumed to not be dependent on variation in the manufacturing process of semiconductor devices. However, because the ratio $\mu$ is changed by such variation, the center frequency setting value CFV is not always set appropriately.

Figure 4:
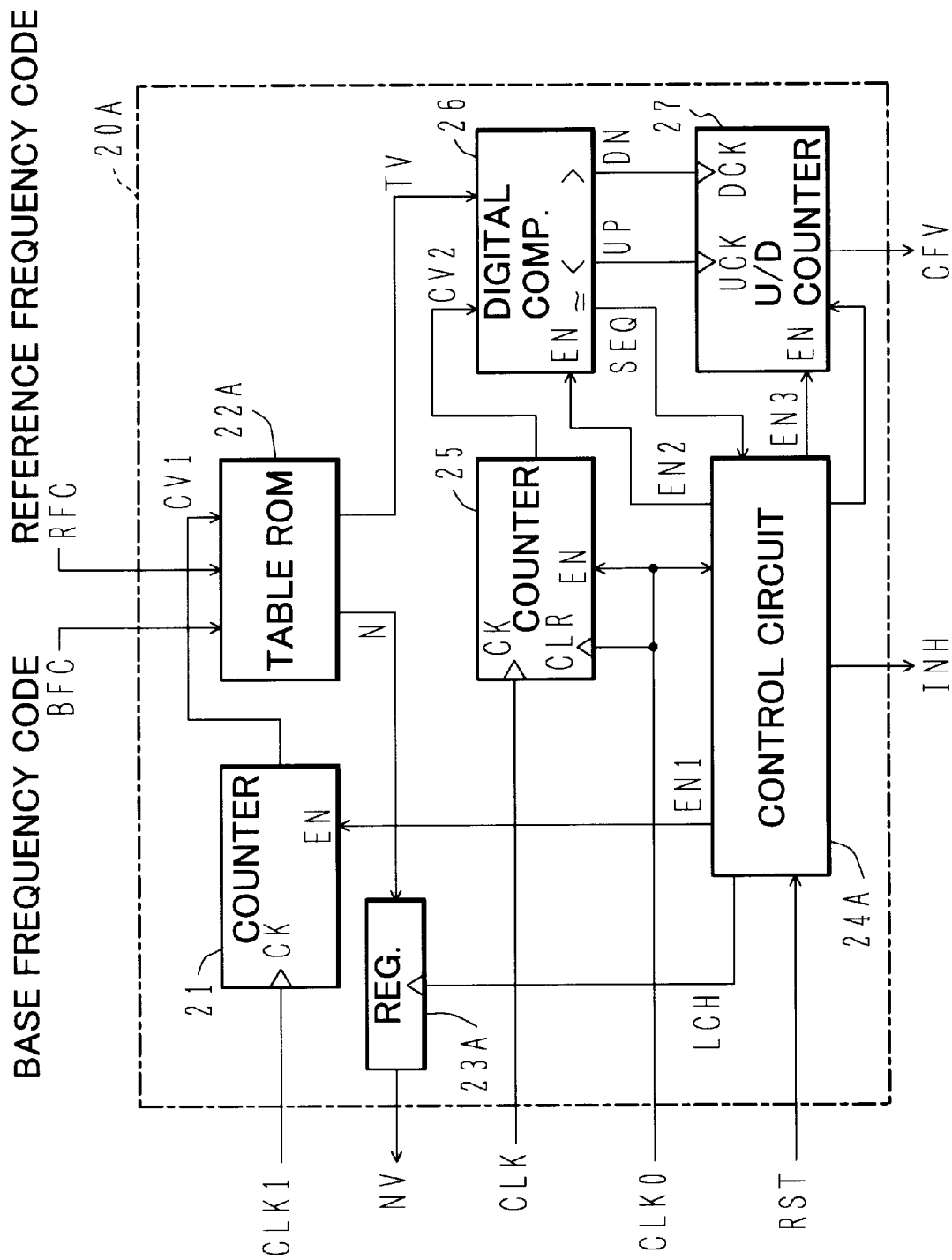
FIG. 4 is a block diagram showing a configuration example of a PLL automatic adjusting circuit in the second embodiment of the present invention.

FIG. 4 shows a PLL automatic adjusting circuit 20A used to solve this problem.

A table ROM 22A differs from the table ROM 22 as shown in FIG. 2 in two respects. First, a base frequency code BFC is added as an higher order address. The frequency of the base clock CLK0 is variable and the base frequency code BFC is determined in accordance with this frequency. Second, the target value TV of the count value CV2 is stored in the table ROM 22A instead of the center frequency setting value CF.

The following TABLE II shows a concrete example of the relationship between addresses of the table ROM 22A and values stored at these addresses.

TABLE II

| ADDRESS | | | STORED VALUE | |
|---|---|---|---|---|
| BFC | RFC | CV1 | N | TV |
| 0 | 0 | 50 | 3 | 20 |
| 0 | 0 | 55 | 3 | 20 |
| 0 | 0 | 60 | 3 | 20 |
| 0 | 0 | 190 | 10 | 20 |
| 0 | 0 | 195 | 10 | 20 |
| 0 | 0 | 200 | 10 | 20 |
| 0 | 1 | 50 | 2 | 25 |
| 0 | 1 | 55 | 2 | 25 |
| 0 | 1 | 60 | 2 | 25 |
| 0 | 2 | 70 | 2 | 30 |
| 0 | 2 | 75 | 3 | 30 |
| 0 | 2 | 80 | 3 | 30 |
| 1 | 0 | 100 | 3 | 40 |
| 1 | 0 | 110 | 3 | 40 |
| 1 | 0 | 120 | 3 | 40 |

In TABLE II, 0 and 1 of the base frequency codes BFC correspond to frequencies 1 MHz and 0.5 MHz of the base clock CLK0, respectively. In the same manner as TABLE I, when the reference frequency code RFC is 0, 1 or 2, the reference frequency is 40 MHz, 50 MHz or 60 MHz, respectively.

The PLL automatic adjusting circuit 20A has a counter 25, a digital comparator 26, and an up/down (U/D) counter 27 to obtain the center frequency setting value CFV from the target value TV.

To the clock input CK of the counter 25, the output clock CLK is provided. To both the clear input CLR and the enable signal input EN of the counter 25, the base clock CLK0 is provided. The digital comparator 26 compares the count value CV2 (when the frequency of the base clock CLK0 is 1 MHz, CV2 is fc/(2N)) of the counter 25 and the output TV (when the frequency of base clock CLK0 is 1 MHz, TV is fr/2) of the table ROM 22A, and outputs the comparison result when the enable signal input EN is at a high voltage level. Namely, the digital comparator 26 raises the up signal UP to a high voltage level when CV2 is less than TV, and raises the down signal DN to a high voltage level when CV2 is greater than DV. The digital comparator 26 also raises approximately equal signal SEQ to a high voltage level when the count value CV2 is almost equal to the target value TV, and lowers the above signals to a low voltage level when the enable signal input EN is at a low voltage level. An up signal UP and a down signal DN are provided to the up clock input UCK and the down clock input DCK of the U/D counter 27 respectively.

When an enable signal EN3 is a high voltage level, the counted value of the U/D counter 27 is incremented with the up signal UP rising and decremented with the down signal DN rising. This counted value is provided to the digital VCO 13 shown in FIG. 1 as the center frequency setting value CFV.

Next, the operation of the PLL automatic adjusting circuit 20A structured as above is described.

A control circuit 24A loads an initial value CFVmax/2 to the U/D counter 27 and raises the inhibition signal INH to a high voltage level in response to the pulse of the reset signal RST. By this operation, the frequency f1 becomes the center free running frequency fco. Operations of the counter 21 and the table ROM 22A, as well as the timing of the holding the program data N in a register 23A are the same as shown in FIG. 2. Processing up to this data holding is the first stage of the adjustment. The program data N is specified so that |fco/N−fr| is minimized. In other words, a rough adjustment is performed so that |fco/N−fr| is minimized in the first stage.

Next, a fine adjustment of the second stage is described.

Figure 5:
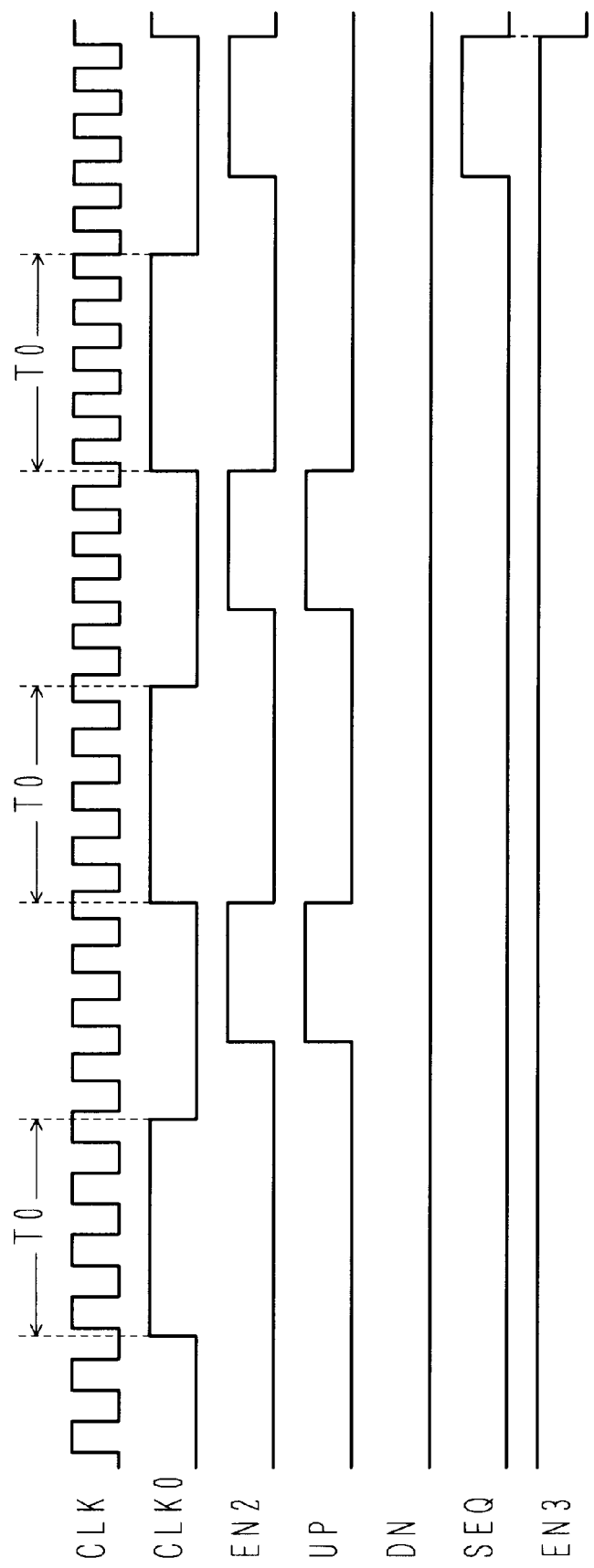
FIG. 5 is a timing chart showing operations of a control circuit and a digital comparator in FIG. 4.

FIG. 5 shows the operations of the control circuit 24A and digital comparator 26.

The count value CV2 of the counter 25 is cleared to zero when the base clock CLK0 rises. After this, the counter 25 counts the output clock CLK during the time T0 until the base clock CLK0 falls.

The voltage levels of the output enable signals EN2 and EN3 remain low (not shown in FIG. 5) until the program data N is held in the register 23A. These enable signals become valid after this holding. After the data N is held, the count value CV2 of the counter 25 becomes fc/(2N).

After the program data N was held, the voltage level of the base clock CLK0 was lowered and the digital comparator 26 compared values, the enable signal EN2 rises to a high voltage level, and the digital comparator 26 outputs the result of the comparison of the count value CV2 and target value TV.

If CV2>TV, namely fc/N>fr, then the center frequency setting value CFV is incremented by a pulse of the up signal UP, the frequency f of output clock CLK rises and fc/N moves closer to the reference frequency fr. Whereas, if CV2>TV, namely fc/N>fr, then the center frequency setting value CFV is decremented by a pulse of the down signal DN, the center frequency fc of the output clock CLK is lowered and fc/N becomes closer to the reference frequency fr. In other words, in the second stage, the fine adjustment is performed so that |fc/N−fr| becomes close to 0.

FIG. 5 shows the case in which the count value CV2 becomes almost equal to the target value TV after CV2<TV occurs twice.

In this second embodiment, the center frequency setting value CFV is adjusted automatically so that the feedback clock frequency fc/N becomes almost equal to the reference frequency fr. With this, the phase is locked quickly and reliably even if there are relatively large variations in digital VCO 13 characteristics because of variations in the manufacturing process of semiconductor devices.

Third Embodiment

Figure 6:
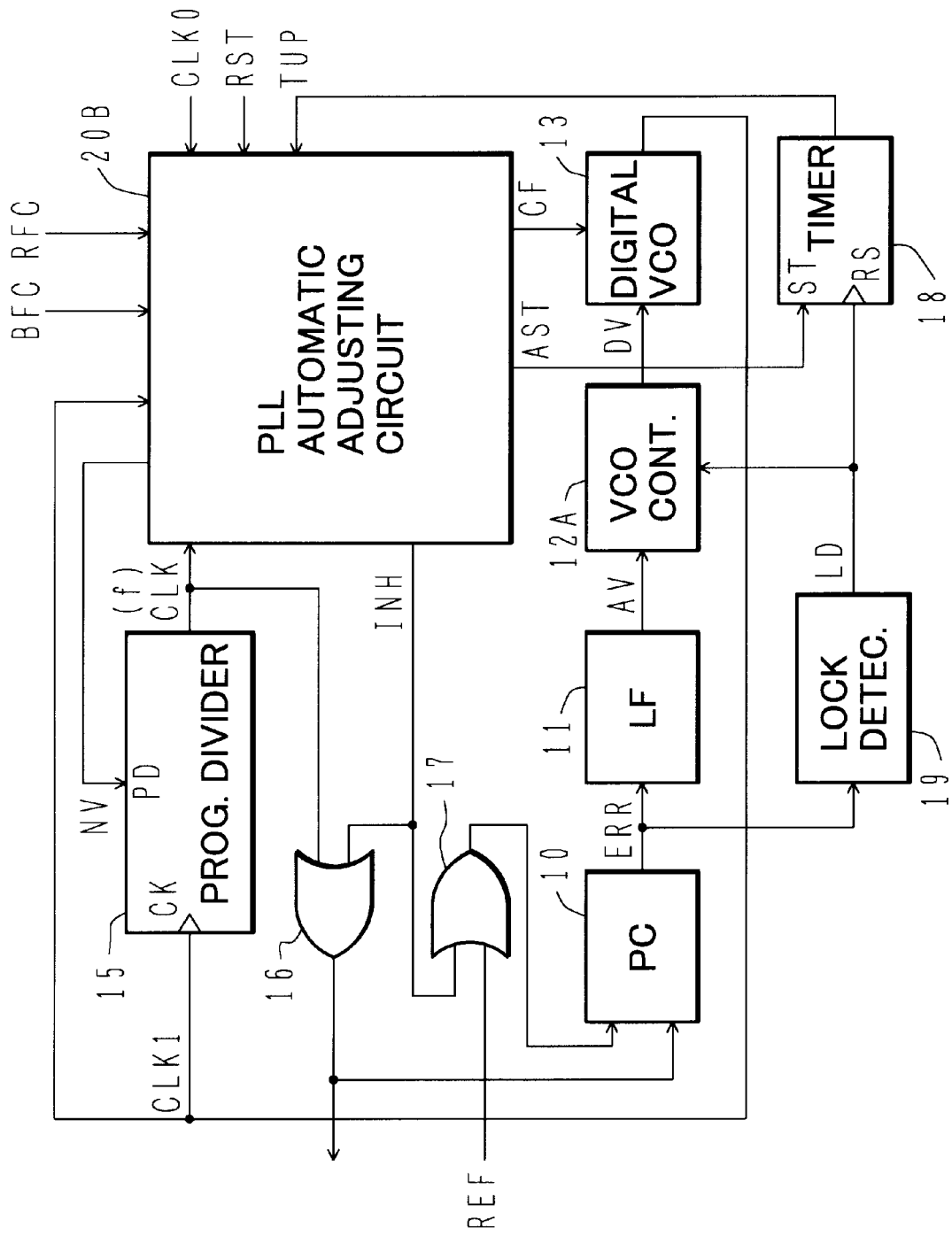
FIG. 6 is a block diagram showing a PLL circuit with an automatic adjusting circuit in the third embodiment of the present invention.

FIG. 6 shows a PLL circuit with an automatic adjusting circuit in the third embodiment of the present invention.

If the counter 21 of FIG. 4 counts a noise, the target value TV or the program data N shifts from a desired value and an adjustment may become inaccurate. In this case, an adjustment time becomes longer than the normal case.

Hence, an adjustment start signal AST from a PLL automatic adjusting circuit 20B is used as a timer start signal to activate a timer 18. After this, if the rise of a reset input RS is not detected within a set time T1 of the timer 18, a time up signal TUP is provided to the PLL automatic adjusting circuit 20B to restart the adjustment. To reset the input RS of the timer 18, a lock detection signal LD from a lock detecting circuit 19 is provided. The lock detecting circuit 19 judges whether the phase is locked based on the phase error signal ERR from the phase comparator 10. If the lock detecting circuit judges that the phase is locked, it raises the lock detection signal LD to a high voltage level.

Figure 7:
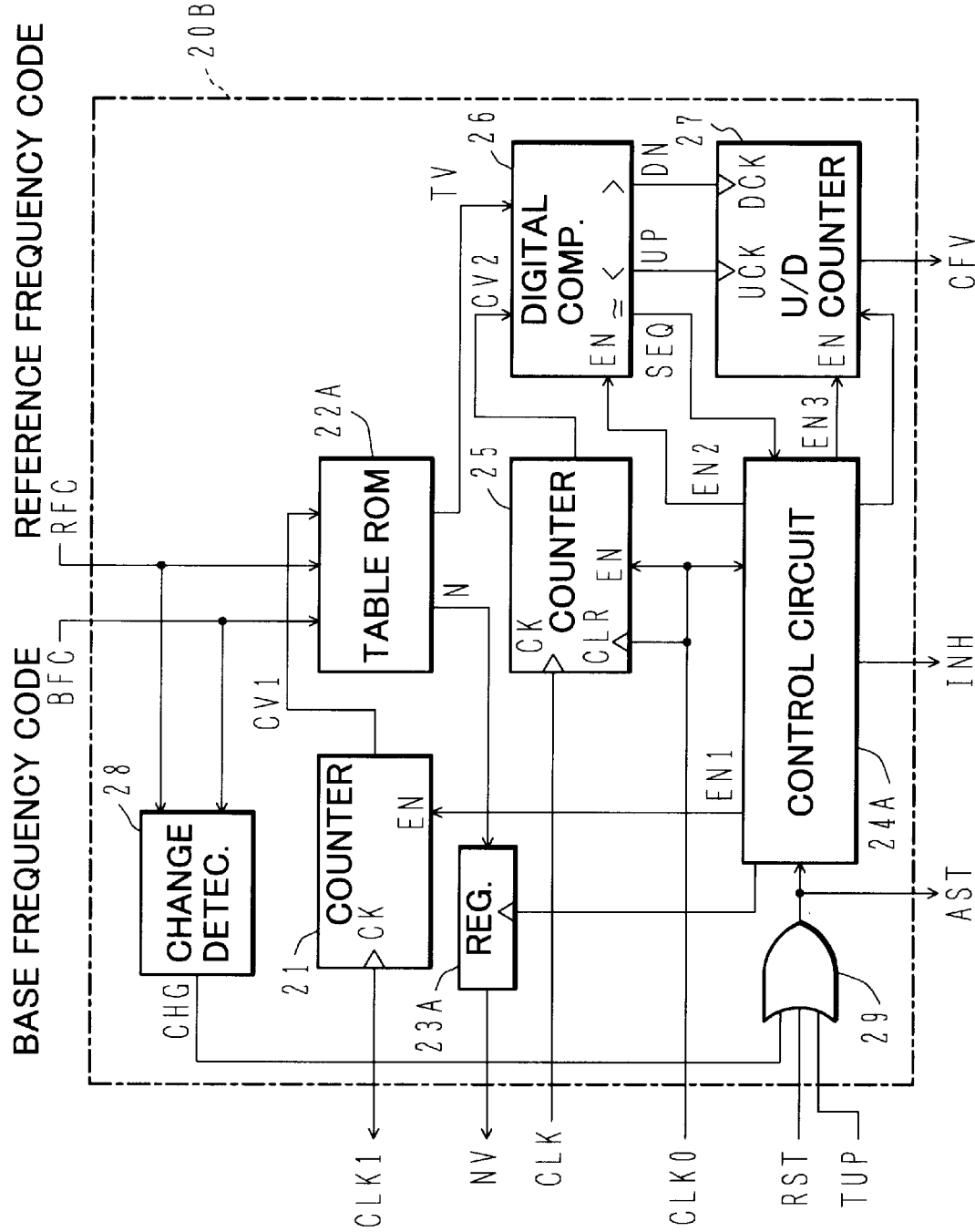
FIG. 7 is a block diagram showing a configuration example of the PLL automatic adjusting circuit shown in FIG. 6.

FIG. 7 shows a configuration example of the PLL automatic adjusting circuit 20B.

The PLL automatic adjusting circuit 20B is modified by adding a change detecting circuit 28 and an OR gate 29 to the PLL automatic adjusting circuit 20A.

When the change detecting circuit 28 detects that the value of the base frequency code BFC or the reference frequency code RFC has changed, it outputs a pulse of a change detection signal CHG. The change detection signal CHG, the reset signal RST and the time up signal TUP are provided to the OR gate 29. The output of the OR gate 29 is provided as the adjustment start signal AST to the control circuit 24A. This adjustment start signal AST operates in the same manner as the reset signal RST shown in FIG. 4.

Figure 8A:
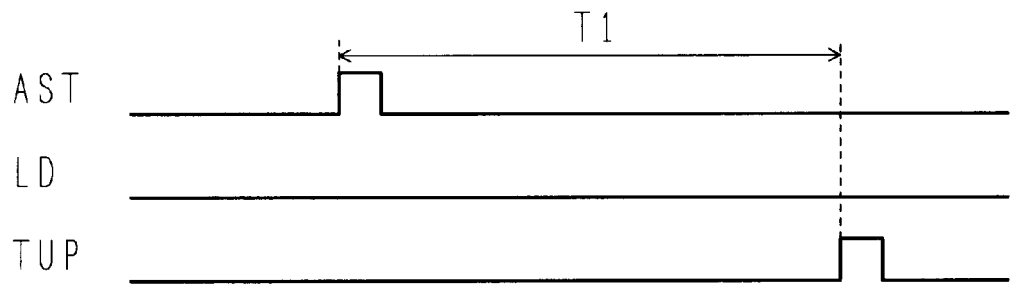
FIGS. 8(A) and 8(B) are timing charts showing operations of a timer shown in FIG. 6.
Figure 8B:
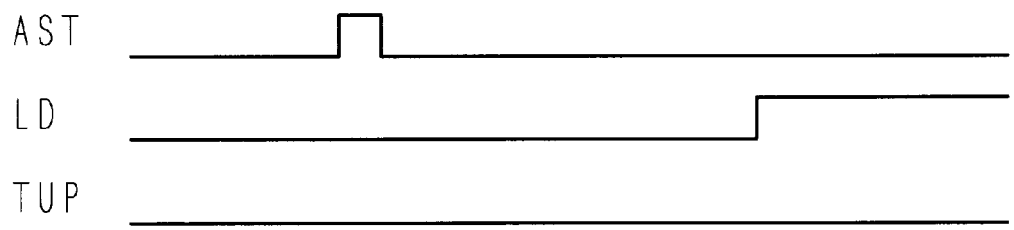

FIGS. 8(A) and 8(B) show cases in which a phase locked state is not detected and is detected respectively when the adjustment time exceeds T1 after the adjustment has started.

In the above configuration, if a pulse of the change detection signal CHG, the reset signal RST or the time up signal TUP is provided to the OR gate 29, the adjustment described above in the second embodiment is performed. If the phase locked state has not detected when the adjustment time exceeded T1, a pulse of the time up signal TUP is output from the timer 18 for readjustment.

Therefore, the readjustment is performed automatically and the reliability of the adjustment improves even if the program data N or the target value TV differs from the desired value because of counting a noise with the counter 21, the adjustment becomes inaccurate and the adjustment time becomes longer than the usual adjustment time.

Because the adjustment is also performed when the base clock frequency f0 or the reference clock frequency fr is changed, the reset switch needs not be pressed after this operation, improving operability.

Figure 8C:
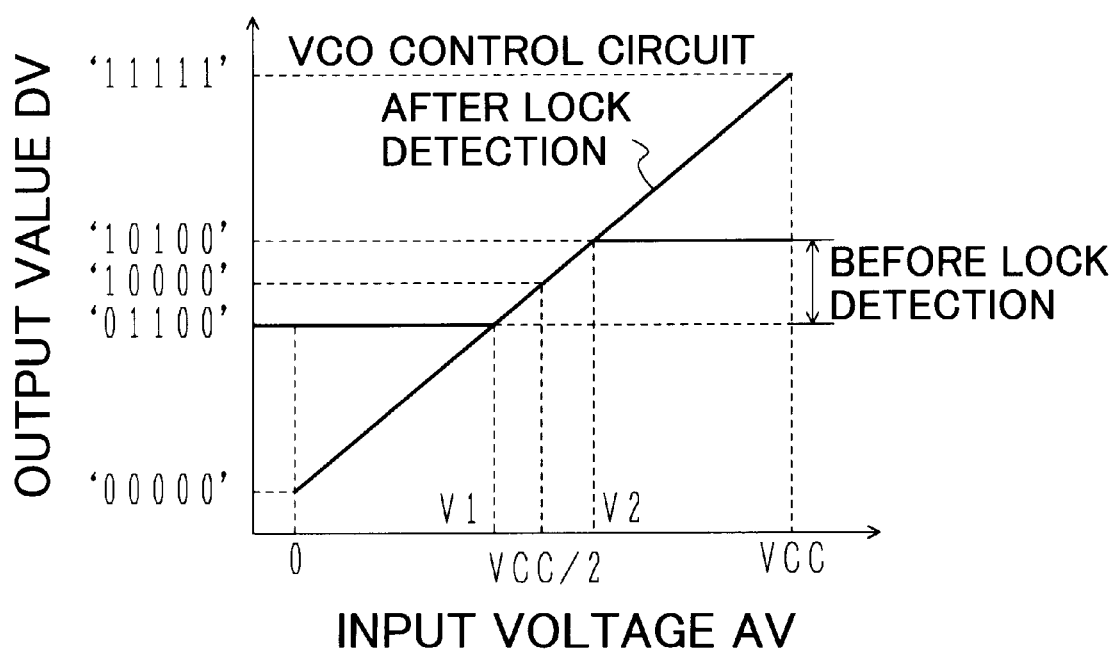
FIG. 8(C) is an input-output characteristic diagram of a VCO control circuit shown in FIG. 6.

Lock detection signal LD is provided to the control input of the VCO control circuit 12A of FIG. 6. The input-output characteristic of the VCO control circuit 12A is switched as shown in FIG. 8(C) in accordance with a high or a low voltage level of the lock detection signal LD. Namely, if the lock detection signal LD is at a low voltage level and does not yet detect the phase lock, DV is fixed to '01100' at 0≦AV≦V1 and DV is fixed to '10100' at V2≦AV≦VCC, and the range of the digital value DV is narrowed to the range binary '01100' to '10100'. When the lock detection signal is at a high voltage level and has already detected the phase lock, the value fixing is removed, and the range of the digital value DV is expanded from binary '00000' to '11111'.

Because the capture range of a PLL circuit is generally narrower than the lock range, pulling the circuit into a phase locked state is performed reliably by switching the characteristic of the VCO control circuit 12A as described above. Moreover, the capture range of the output frequency f in which the phase locked state can be held after the phase lock is detected is widened.

Although preferred embodiments of the present invention has been described, it is to be understood that the invention is not limited thereto and that various changes and modifications may be made without departing from the spirit and scope of the invention.

For example, in the above first embodiment, only the higher order bits of the count value CV1 of the counter 21 may be provided to the address input of the table ROM 22. A RAM or a data conversion circuit may be used instead of using the table ROM 22 as the data converter. This data conversion circuit may be a arithmetic circuit that calculates an output value based on an input value. The PLL automatic adjusting circuit 20 may adjust only the program data N. In this case, the VCO control circuit 12 and the digital VCO 13 may be replaced by an analog VCO. The input-output characteristic of the analog VCO may be adjusted by a PLL automatic adjusting circuit.

In the above second embodiment, although counting intervals for counters 21 and 25 are specified to be a half cycle of the base clock CLK0, there is no problem if the counting intervals are determined. For example, the counting interval for the counter 25 may be N times of the counting interval for the counter 21. Clocks with different cycles may be used to determine counting intervals for the counters 25 and 21. Although described the case in which the digital comparator 26 is used to detect the near equality between the count value CV2 and target value TV to fix the count value of the U/D counter 27, the value of U/D counter 27 may be fixed when the sign of difference (CV2−TV) is inverted. The output value of the U/D counter 27 may be provided to the control input of the VCO 13 via a register or a constant multiplier.

In the above third embodiment, there is a phase comparator which can detect both of a phase error and a phase lock and in this case, the lock detecting circuit 19 is unnecessary.

Although described the case in which the PLL automatic adjusting circuit is validated only during specified times such as a reset time in the first to third embodiments, the PLL automatic adjusting circuit may always be valid. When validating the PLL automatic adjusting circuit during a specified time such as a reset, power may be supplied to the PLL automatic adjusting circuit only during a valid time. The input value of the VCO control circuit 12 or the digital VCO 13 may be fixed during this valid time without using the OR gates 16 and 17.

The counter 21 may be one which essentially counts the output clock of the VCO and, for example, the program data N of the program frequency divider 15 may be set to a specified value to count the output clock of the program frequency divider. In this case, the counter 25 may be omitted by switching the output destination of the counter 21.

What is claimed is:

1. A PLL automatic adjusting circuit for adjusting a program data N stored in a PLL circuit, N being an integer, said PLL circuit including a 1/N programmable frequency divider for dividing an output frequency of a VCO by said program data N, said 1/N programmable frequency divider being connected between an output of said VCO and one input of a phase comparator, said PLL automatic adjusting circuit comprising:

a first counter for counting an output clock of said VCO for a set time; and a data converter for setting said program data N in accordance with a count value of said first counter, wherein said data converter is a memory for converting an input address value into a stored value.

2. A PLL automatic adjusting circuit for adjusting a program data N stored in a PLL circuit, N being an integer, said PLL circuit including a 1/N programmable frequency divider for dividing an output frequency of a VCO by said program data N, said 1/N programmable frequency divider being connected between an output of said VCO and one input of a phase comparator, said PLL automatic adjusting circuit comprising:

a first counter for counting an output clock of said VCO for a set time;

a data converter for setting said program data N in accordance with a count value of said first counter; and a control circuit for controlling, in response to an adjustment start signal, said output frequency of said VCO to a center free running frequency until said program data N has been set.

3. A PLL automatic adjusting circuit according to claim 2, further comprising:

a register for receiving an output value of said data converter;

wherein said control circuit makes said register hold its input value after said output value of said data converter has been determined.

4. A PLL automatic adjusting circuit for adjusting a program data N stored in a PLL circuit, N being an integer, said PLL circuit including a 1/N programmable frequency divider for dividing an output frequency of a VCO by said program data N, said 1/N programmable frequency divider being connected between an output of said VCO and one input of a phase comparator, said PLL automatic adjusting circuit comprising:

a first counter for counting an output clock of said VCO for a set time; and a data converter for setting said program data N in accordance with a count value of said first counter, wherein said VCO has a control input for changing its input-output characteristic, and wherein said data converter outputs a control setting value corresponding to said count value of said first counter and said program data N in order to determine a value to be provided to said control input of said VCO.

5. A PLL automatic adjusting circuit according to claim 4, further comprising:

a register for receiving said control setting value and for providing its holding value to said control input of said VCO; and a control circuit for making said register hold its input value after said control setting value having been determined.

6. A PLL automatic adjusting circuit according to claim 4, further comprising:

a second counter for counting an output clock of said 1/N programmable frequency divider for a set time;

a comparator for comparing a count value of said second counter with said control setting value from said data converter; and an up/down counter for incrementing or decrementing in accordance with a comparison result of said comparator;

a value based on a count value of said up/down counter being provided to said control input of said VCO.

7. A PLL automatic adjusting circuit according to claim 6, further comprising:

a control circuit for, in response to an adjustment start signal, fixing a value provided to an input of said VCO to approximately a center value until said program data N is set and for controlling a value of said control input of said VCO to approximately a center value until said value based on said count value of said up/down counter is provided to said control input.

8. A PLL automatic adjusting circuit according to claim 7, wherein said value provided to said control input of said VCO is said count value of said up/down counter.

9. A PLL circuit with an automatic adjusting circuit, said automatic adjusting circuit adjusting a program data N stored in said PLL circuit, said PLL circuit including a 1/N programmable frequency divider for dividing an output frequency of a VCO, said 1/N programmable frequency divider being connected between an output of said VCO and an input of a phase comparator, said PLL automatic adjusting circuit comprising:

a first counter for counting an output clock of said VCO for a set time;

a data converter for setting said program data N in accordance with a count value of said first counter; and a control circuit for controlling, in response to an adjustment start signal, said output frequency of said VCO to a center free running frequency until said program data N has been set.

10. A PLL circuit with an automatic adjusting circuit according to claim 9, further comprising:

a lock detecting circuit for detecting whether said PLL circuit has entered into a phase synchronizing state; and a timer for reactivating said adjustment start signal when a time, from said adjustment start signal becoming active to said lock detecting circuit detecting a phase synchronization state, has exceeded a set time.

11. A PLL circuit with an automatic adjusting circuit according to claim 9, wherein an input value of said VCO is digital and said input valve depends on an output of said phase comparator, further comprising:

a VCO control circuit, for converting an analog voltage to said digital value, arranged in a pre-stage of said VCO, said VCO control circuit having a control input for switching its output range from a first range to a second range, said second range being wider than said first range; and a lock detecting circuit for detecting a phase synchronization state and providing its detected signal to said control input of said VCO control circuit in order to set said output range of said VCO control circuit to said first range when it detects that said VCO control circuit is not in said phase synchronization state and in order to set said output range of said VCO control circuit to said second range when it detects said phase synchronization state.

\* \* \* \* \*